United States Patent
Kim

(10) Patent No.: US 8,275,934 B2
(45) Date of Patent: Sep. 25, 2012

(54) NONVOLATILE MEMORY DEVICE AND CACHE READ METHOD USING THE SAME

(75) Inventor: Myung Su Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 297 days.

(21) Appl. No.: 12/646,652

(22) Filed: Dec. 23, 2009

(65) Prior Publication Data

US 2010/0185812 A1   Jul. 22, 2010

(30) Foreign Application Priority Data

Jan. 21, 2009   (KR) ..................... 10-2009-0005069

(51) Int. Cl.
   *G06F 12/00*   (2006.01)
(52) U.S. Cl. ................. 711/103; 711/219; 711/E12.017
(58) Field of Classification Search .................. 711/103, 711/E12.001, E12.017, 219; 712/225, 36, 712/E9.042

See application file for complete search history.

(56) References Cited

U.S. PATENT DOCUMENTS

| | | | | |
|---|---|---|---|---|
| 6,182,207 B1* | 1/2001 | Poivre et al. | .................. | 711/103 |
| 2003/0126338 A1* | 7/2003 | Dodd et al. | .................. | 710/305 |
| 2003/0188091 A1* | 10/2003 | Wyatt et al. | .................. | 711/111 |
| 2005/0146805 A1* | 7/2005 | Manzone et al. | ............... | 360/69 |

FOREIGN PATENT DOCUMENTS

| | | |
|---|---|---|
| KR | 1998-701666 | 6/1998 |
| KR | 1020040054225 A | 6/2004 |
| KR | 1020040067641 A | 7/2004 |
| KR | 1020060070030 A | 6/2006 |

\* cited by examiner

*Primary Examiner* — Pierre-Michel Bataille
(74) *Attorney, Agent, or Firm* — IP & T Group LLP

(57) ABSTRACT

A nonvolatile memory device includes first and second registers configured to store parameters received via an input/output (IO) unit, a microcontroller configured to control an operation of the nonvolatile memory device according to the parameter stored in the first register, and a control logic unit configured to, when a parameter is received via the IO unit while the microcontroller performs an internal operation, store the received parameter in the second register.

7 Claims, 5 Drawing Sheets

NONVOLATILE MEMORY DEVICE AND CACHE READ METHOD USING THE SAME

CROSS-REFERENCE TO RELATED APPLICATION

Priority to Korean patent application number 10-2009-0005069 filed on Jan. 21, 2009, the entire disclosure of which is incorporated by reference herein, is claimed.

BACKGROUND

Embodiments relate to a nonvolatile memory device and a cache read method thereof.

In recent years, there is an increasing demand for nonvolatile memory devices which can be electrically programmed and erased and which do not require the refresh function of rewriting data at specific intervals.

The nonvolatile memory device is configured to enable electrical program and erase operations and perform the program and erase operations by having threshold voltages to be varied when electrons are moved by a strong electric field applied to a thin oxide layer.

The nonvolatile memory device may include a memory cell array in which cells for storing data are arranged in a matrix form and a page buffer for writing data into specific cells of the memory cell array or reading data stored in specific cells thereof. The page buffer includes a bit line pair coupled to a specific memory cell, a register for temporarily storing data to be written into the memory cell array or reading data stored in a specific memory cell of the memory cell array and temporarily storing the read data, a sense node for sensing the voltage level of a specific bit line or a specific register, and a bit line selection unit for controlling whether or not to couple the specific bit line to the sensing node.

Of several read methods of the nonvolatile memory device, a cache read method for reducing the time that it takes to perform a read operation may be used. In the case where each page buffer includes two registers, one of the two registers performs a read operation, and the other of the registers performs an operation for outputting read data externally.

However, in the case where a read method using cache is repeatedly performed, parameters for the operations may also be changed. In particular, in the case where a read voltage (i.e., a reference of the read operation) is to be changed to accommodate the read method using cache, there is a need for a method of changing the read voltage while the cache read operation continues to be performed.

BRIEF SUMMARY

Embodiments relate to a nonvolatile memory device and a cache read method using the same, which are capable of changing a plurality of parameters during a cache read operation.

A nonvolatile memory device according to an embodiment includes first and second registers configured to store parameters received via an input/output (IO) unit, a microcontroller configured to control an operation of the nonvolatile memory device according to the parameter stored in the first register, and a control logic unit configured to, when a parameter is received via the IO unit while the microcontroller performs an internal operation, store the received parameter in the second register.

A cache read method using a nonvolatile memory device according to another embodiment includes receiving a parameter setting command for setting parameters for a cache read operation, determining whether an internal operation is performed based on an output internal busy signal output from a microcontroller, if, as a result of the determination, the microcontroller is determined not to perform the internal operation, receiving a parameter and storing the received parameter in a first register, if, as a result of the determination, the microcontroller is determined to perform the internal operation, receiving a parameter and storing the received parameter in a second register, when a cache read command is received, storing a value, stored in the second register, in the first register according to information stored in a flag of the second register, and performing a cache read operation according to the parameter stored in the first register.

DESCRIPTION OF EMBODIMENTS

Hereinafter, the present disclosure will be described in detail in connection with embodiments with reference to the accompanying drawings. The drawings of figures are provided to allow those having ordinary skill in the art to understand the scope of the embodiments of the disclosure.

Figure 1:
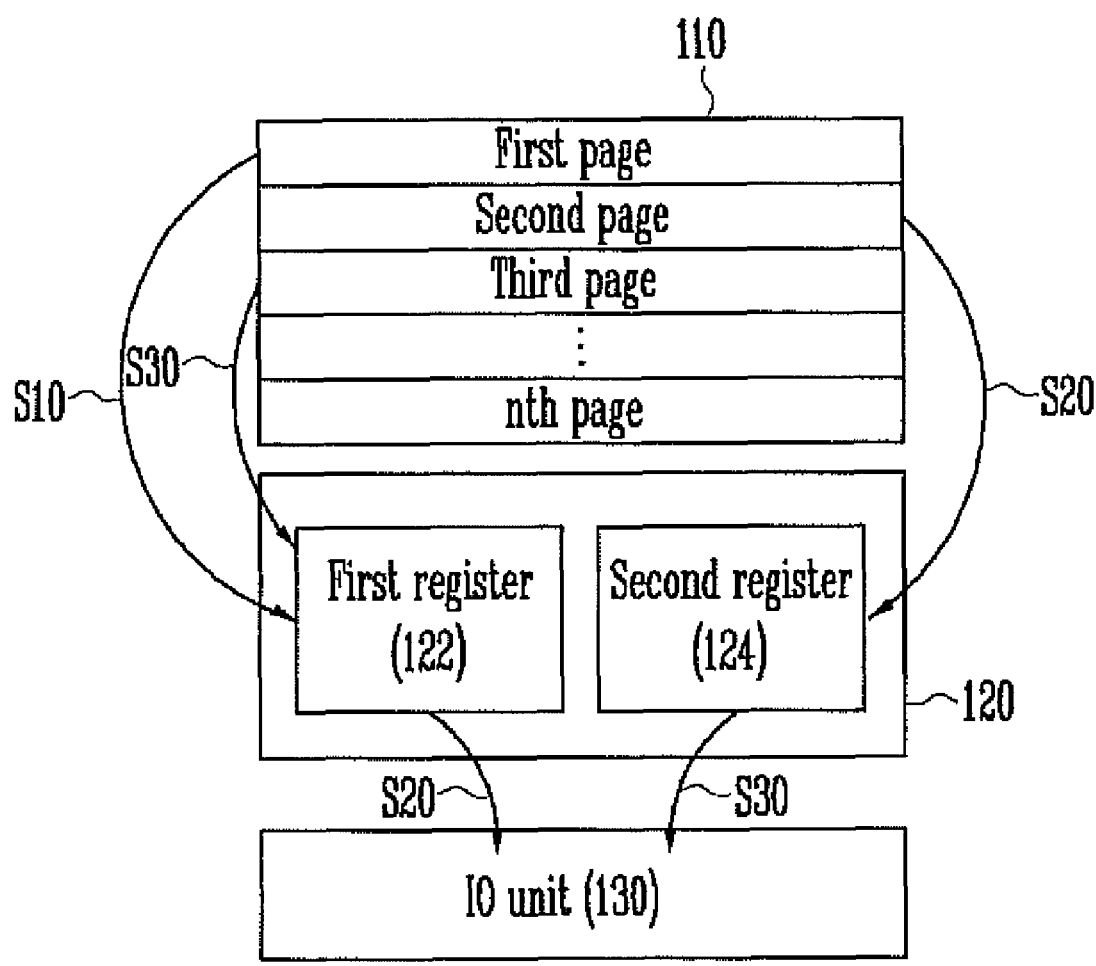
FIG. 1 is a diagram showing the cache read operation of a nonvolatile memory device.

FIG. 1 is a diagram showing the cache read operation of a nonvolatile memory device.

The nonvolatile memory device 100 includes a memory cell array 110 having memory cells arranged in accordance with a page-by-page basis, a page buffer unit 120 having page buffers each including different registers, and an IO unit 130 inputting or outputting data.

The memory cell array 110 includes a plurality of the memory cells arranged in accordance with a page-by-page basis (i.e. the unit of a program operation or the unit of a read operation).

The page buffer unit 120 includes a plurality of page buffers that are coupled to the memory cells, respectively, and configured to temporarily store data. Here, each of the page buffers includes a first register 122 and a second register 124 for storing data.

A cache read operation is described below. The cache read operation requires two different data repositories for each page buffer unlike in a conventional read operation.

First, a read operation is performed on a first page, and the data read by the read operation is stored in the first register of each of the page buffers at step S10.

Next, the data of the first page stored in the first register is output externally and, at the same time, a read operation is performed on a second page. The data read by the read operation is stored in the second register of each of the page buffers at step S20. Since the data output operation and the data read operation are performed at the same time as described above, the time that it takes to perform the read operation can be reduced.

In a similar way, the data of the second page stored in the second register is output externally and, at the same time, a read operation is performed on a third page. The data read by the read operation is stored in the first register of each of the page buffers at step S30.

An exemplary embodiment of the invention is directed to a method of changing a read voltage during a cache read operation. The read voltage is applied to a word line of a target cell during the read operation of a nonvolatile memory device. In a multi-level cell (MLC) program operation for storing 2 bits, unlike a single level cell (SLC) program operation for storing 1 bit, cells have several states. In order to distinguish the states of the cells, a plurality of different read voltages are required. Accordingly, it is necessary to perform a read operation while changing the read voltages. Thus, methods of reading read voltages while changing the read voltages according to a change in the temperature are recently being developed. An exemplary embodiment of the invention proposes a cache read operation which can be applied to the above described methods.

Figure 2:
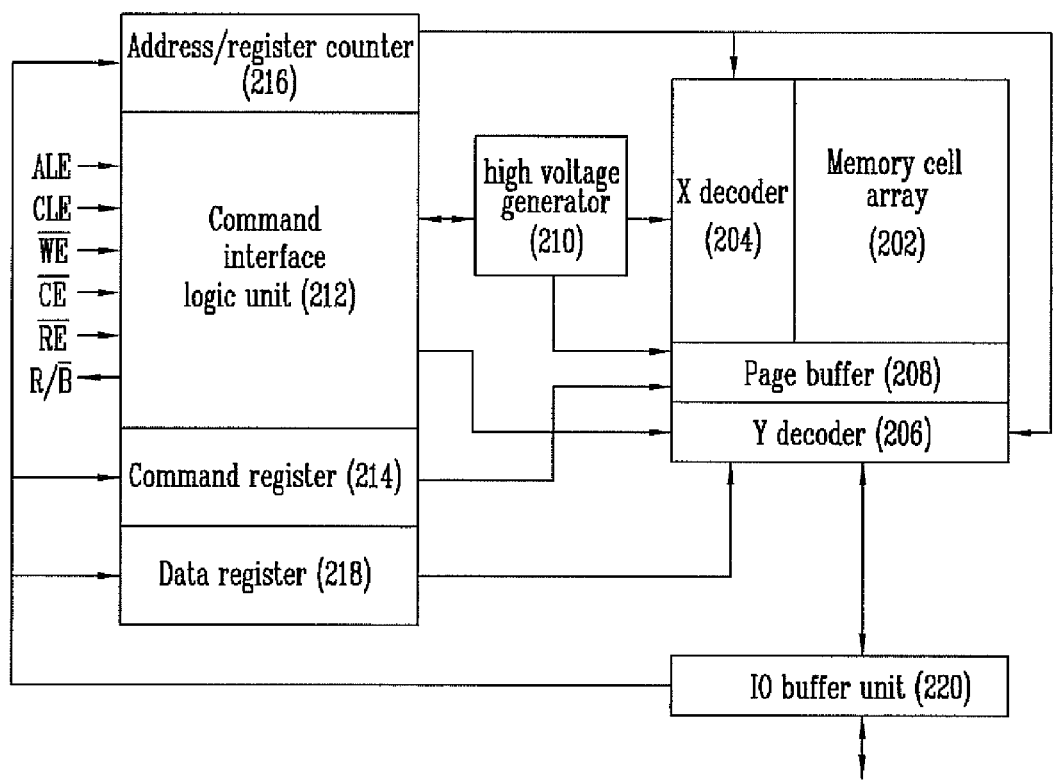
FIG. 2 is a diagram showing the overall construction of a nonvolatile memory device to which the present disclosure is applied.

FIG. 2 is a diagram showing the overall construction of a nonvolatile memory device to which an exemplary embodiment of the invention is directed.

The nonvolatile memory device 200 includes a memory cell array 202, a page buffer 208, X and Y decoders 204 and 206, a high voltage generator 210, a command interface logic unit 212, a command register 214, an address register/counter 216, a data register 218, and an IO (input/output) buffer unit 220. The operation of the nonvolatile memory device is described below.

First, when a chip enable signal /CE is activated and a write enable signal /WE is toggled for the command interface logic unit 212, the command interface logic unit 212 and the command register 214 each receive a command signal via the IO buffer unit 220. The command interface logic unit 212 generates a program command, an erase command, or a read command in response to the command signal. The command signal includes a page program setup code which determines an operation mode of the nonvolatile memory device. Meanwhile, an operation state signal R/B̄ output from the command interface logic unit 212 is disabled for a certain period of time. An external memory controller (not shown) receives the operation state signal R/B̄, and the nonvolatile memory device recognizes an operation state such as a program, erasure, or read operation. That is, while the operation state signal R/B̄ is disabled, a program, erasure, or read operation for one of the pages of the memory cell array is performed.

Furthermore, the address register/counter 216 receives an address signal via the IO buffer unit 220 and generates a row address signal and a column address signal. The address signal corresponds to one of pages included in one of memory cells. The data register 218 temporarily stores various data received via the IO buffer unit 220 and transfers the data to the Y decoder 206.

The high voltage generator 210 generates bias voltages in response to the program command, the erase command, or the read command and supplies them to the page buffer 208, the X decoder 204, etc.

In response to the row address signal, the X decoder 204 supplies the received bias voltages to one of the blocks of the memory cell array 202. In response to the column address signal, the Y decoder 206 supplies a data signal to bit lines (not shown) shared by the blocks of the memory cell array 202 through the page buffer 208.

The page buffer 208 latches the data signal received via the IO buffer unit 220 and the Y decoder 206 and outputs to bit lines (not shown) shared by the blocks of the memory cell array 202.

Figure 3:
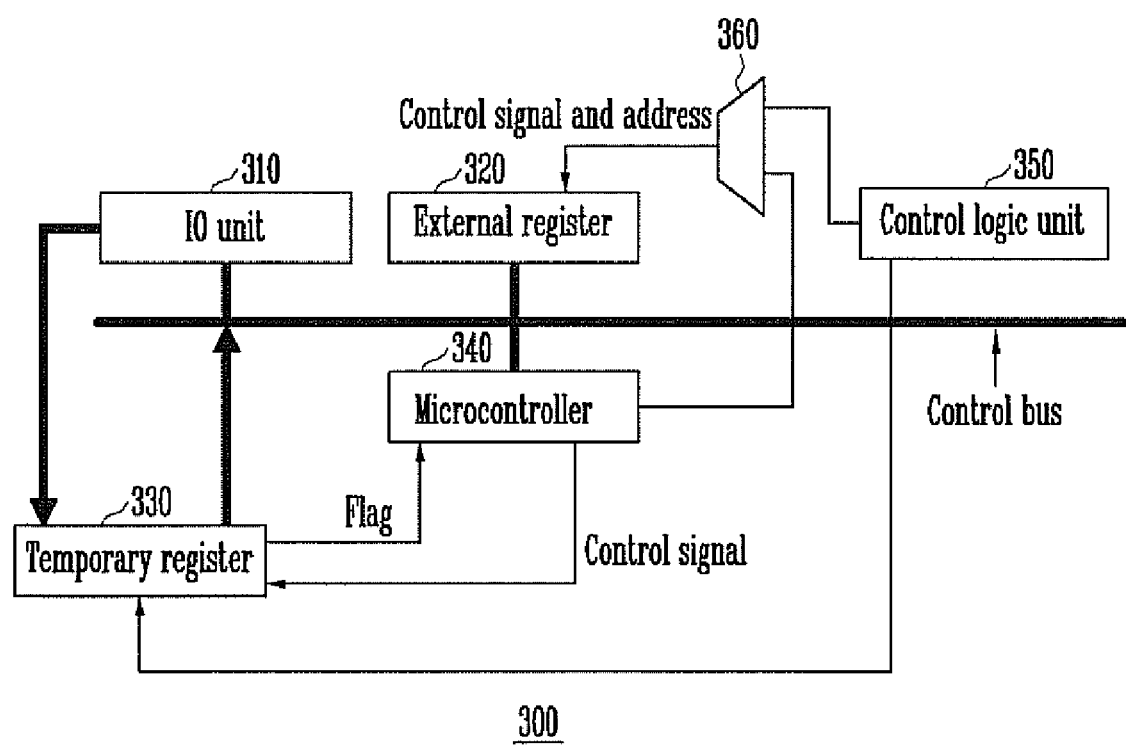
FIG. 3 is a diagram showing the internal construction of the command interface logic unit of the nonvolatile memory device according to an embodiment.

FIG. 3 is a diagram showing the internal construction of the command interface logic unit of the nonvolatile memory device according to an embodiment.

The command interface logic unit 300 includes an IO unit 310 for receiving or outputting data, addresses, and commands, an external register 320 and a temporary register 330 for storing various data and addresses, a microcontroller 340, a control logic unit 350, and a control selection unit 360.

The IO unit 310 transfers externally input data, addresses, and commands to the temporary register 330, the external register 320, and the microcontroller 340 through a control bus. Furthermore, the IO unit 310 outputs data, addresses, and commands, received from the temporary register 330, the external register 320, and the microcontroller 340, to the outside.

The external register 320 and the temporary register 330 perform a function of storing data under the control of the microcontroller 340. However, according to an exemplary embodiment of the invention, the external register 320 and the temporary register 330 perform slightly different functions. More specifically, the microcontroller 340 basically performs all control operations based on data or address information stored in the external register 320. Here, in the case where, if an internal busy signal is output because the microcontroller 340 is performing a specific operation and the microcontroller 340 is to attempt to update data or address information pertinent to the specific operation, the microcontroller 340 stores an updated value in the temporary register 330. Next, the microcontroller 340 moves the updated value, stored in the temporary register 330, to the external register 320 and performs an operation according to the updated data.

The control logic unit 350 determines whether to store a variety of parameters, received through the control bus, in the external register 320 or the temporary register 330 by checking whether the microcontroller 340 is performing an operation. If, as a result of the check, the microcontroller 340 is determined to be performing an operation, the control logic unit 350 sets the flag of the temporary register 330 to a logic high level, thereby indicating that the microcontroller is performing an operation.

As described above, due to use of the temporary register 330, a new read voltage can be input while a cache read operation is being performed, and so the cache read operation is performed based on the new read voltage.

Figure 4:
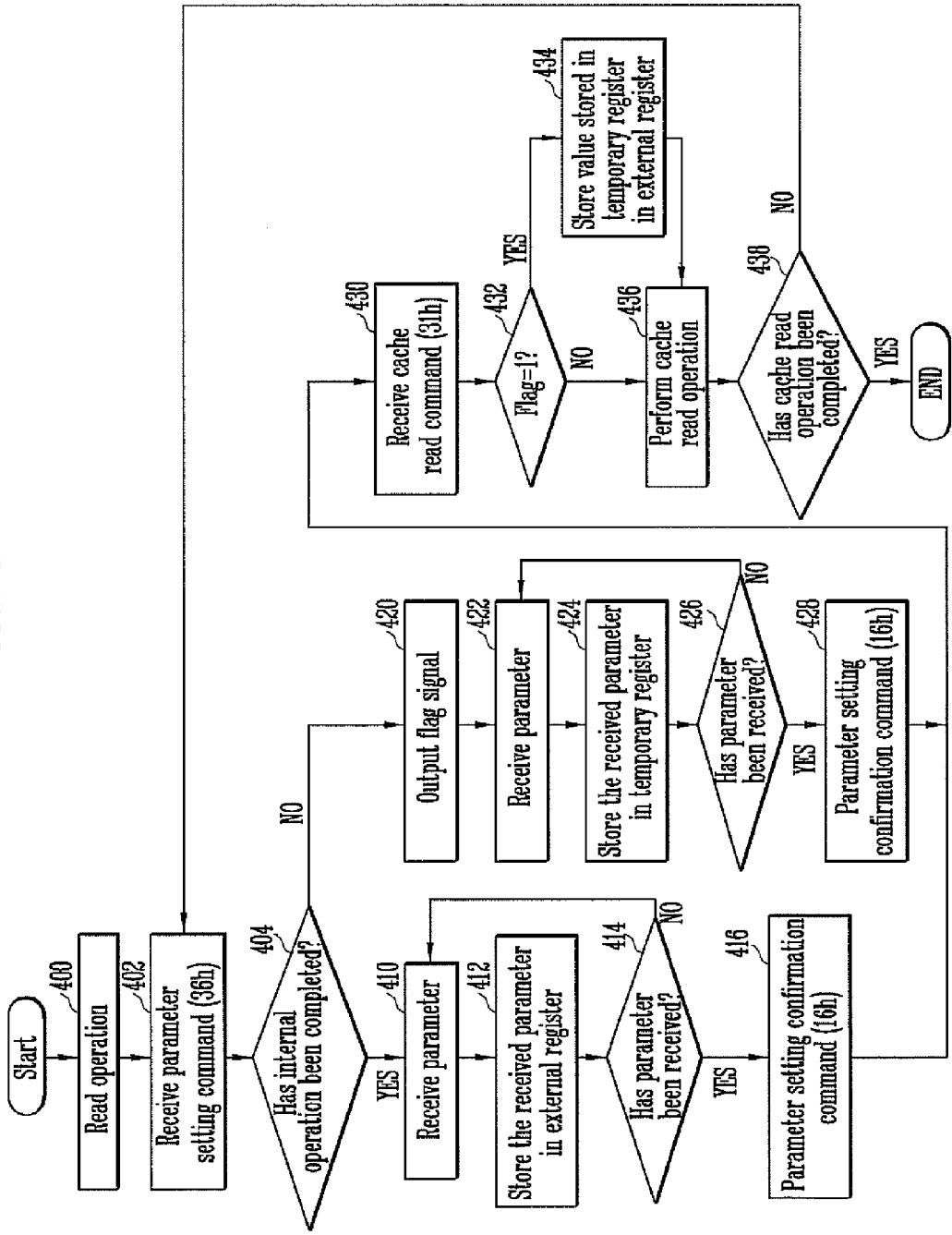
FIG. 4 is a flowchart illustrating the cache read method of the nonvolatile memory device according to an embodiment.
Figure 5:
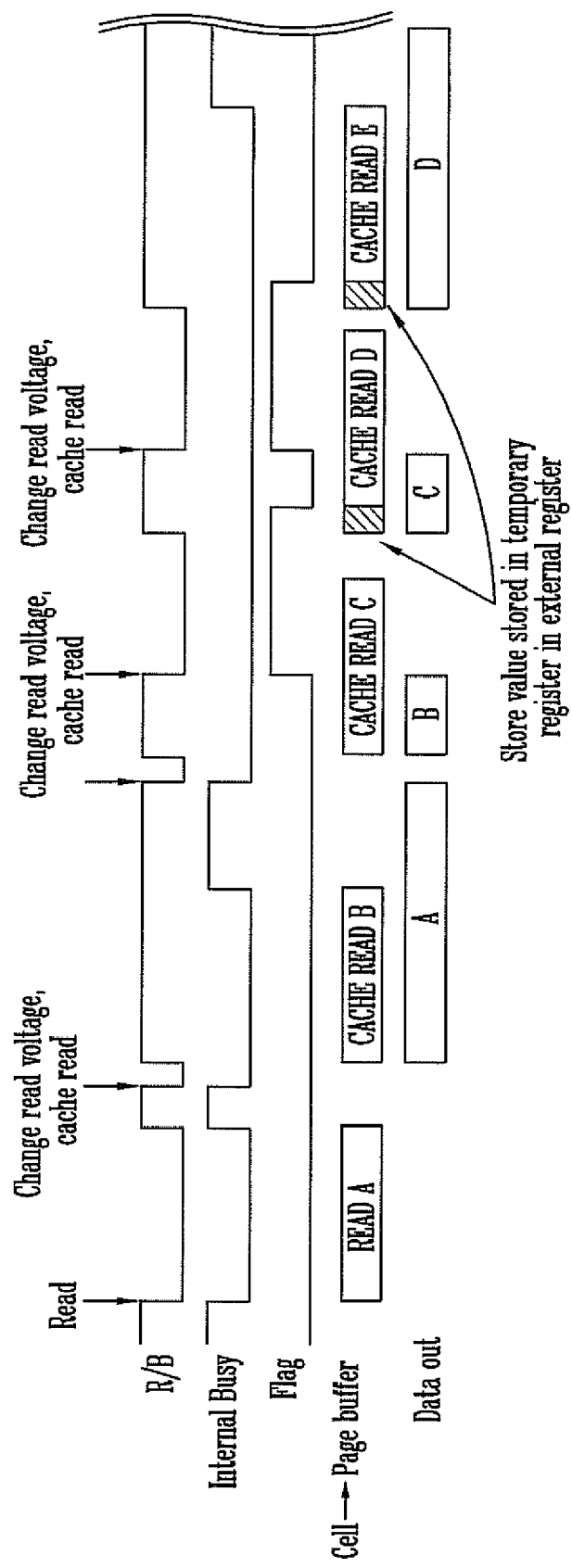
FIG. 5 is a timing diagram showing the cache read operation of the nonvolatile memory device according to an embodiment.

FIG. 4 is a flowchart illustrating the cache read method of the nonvolatile memory device according to an embodiment, and FIG. 5 is a timing diagram showing the cache read operation of the nonvolatile memory device according to an embodiment.

First, a general read operation is performed at step 400.

That is, as shown at step S10 in FIG. 1, a read operation using the first register 122 is performed. FIG. 5 illustrates that data 'A' stored in a memory cell is stored in a page buffer as a result of the read operation. Meanwhile, the nonvolatile memory device outputs a ready busy bar signal R/B to an external host, etc. according to the read operation. Furthermore, the microcontroller outputs an internal busy signal Internal Busy of a logic low level, thereby informing that the microcontroller is operating.

Next, a parameter setting command for setting parameters pertinent to a cache read operation is input at step 402.

According to an exemplary embodiment of the invention, in performing the cache read operation, parameters, such as a read voltage, are to be changed. The parameters, such as the read voltage, are values stored in the external register. Accordingly, in order to change the read voltage, parameters, such as a changed read voltage value and an address of the external register at which the read voltage is stored, are received.

When the parameter setting command is input, it is checked whether an internal operation of the microcontroller has been completed at step 404. Such a check is performed based on the internal busy signal Internal Busy output from the microcontroller. That is, when the internal busy signal Internal Busy of a logic low level is output, it is determined that the microcontroller is performing an internal operation.

If, as a result of the check at step 404, the internal operation is determined to have been completed, parameters are received at step 410, and the received parameters are stored in the external register 320 at step 412. Since the microcontroller is not performing an internal operation, problems such as data collision do not occur although the parameters are directly stored in the external register 320.

It is then determined whether the parameters have been fully received at step 414. If, as a result of the determination at step 414, the parameters are determined not to have been fully received, the process returns to the step 410 for continuing to receive the parameters. However, if, as a result of the determination at step 414, the parameters are determined to have been fully received, the operation of receiving the parameters is stopped according to a parameter setting confirmation command 16h at step 416.

Meanwhile, if, as a result of the check at step 404, the internal operation is determined not to have been completed, the parameters are stored in the temporary register. Prior to storing the parameters in the temporary register, a logic high-level signal is stored in the flag of the temporary register 330 under the control of the control logic unit 350 at step 420.

Next, the parameters are received and stored in the temporary register 330 at steps 422 and 424. Here, if the parameters are directly stored in the external register 320, a data collision may occur because the microcontroller is performing an operation according to the parameters stored in the external register 320. In order to prevent such a data collision, the parameters are stored in the temporary register 330.

It is then determined whether the parameters have been fully received at step 426. If, as a result of the determination at step 426, the parameters are determined not to have been fully received, the process returns to the step 422 for continuing to receive the parameters. However, if, as a result of the determination at step 426, the parameters are determined to have been fully received, the operation of receiving the parameters is stopped according to a parameter setting confirmation command 16h at step 428.

Operations of receiving and storing a variety of parameters for a cache read operation are performed according to the steps.

Next, a cache read command 31h is received at step 430.

In response to the cache read command 31h, it is first determined whether parameters are being stored based on flag information of the temporary register at step 432. In other words, it is determined whether a cache read command corresponding to a read voltage being changed has been received while an immediately-before cache read operation was being performed.

If, as a result of the determination at step 432, a flag signal of a logic low level (the flag signal≠1) is stored in the external register 320, a cache read operation is performed at step 436.

As shown in FIG. 5, when the flag signal is in a logic low level, cache read operations B and C are performed using a parameter value stored in the external register 320.

However, if, as a result of the determination at step 432, a flag signal of a logic high level (the flag signal=1) is stored in the external register 320, a parameter value stored in the temporary register 330 is stored in the external register 320 at step 434. Next, a cache read operation is performed according to a changed parameter value at step 436.

If there is an additional cache read operation to be performed, the steps are repeatedly performed in response to step 438.

A read voltage can be changed and set even while a cache read operation is being performed according to the above-described operation, and the cache read operation can be performed according to the changed read voltage.

According to the present disclosure, when the execution of a cache read operation is stopped and even when a cache read operation is being performed, parameters for a variety of operations can be changed. In particular, since a read voltage can be changed even while a cache read operation is being performed, an MLC program operation can be performed more efficiently. Furthermore, the method according to the present disclosure can also be applied to a method of reading a read voltage while changing the read voltage according to a change in the temperature.

What is claimed is:

1. A cache read method using a nonvolatile memory device, comprising:
   receiving a parameter setting command for setting parameters for a cache read operation;
   determining whether an internal operation is performed based on an output internal busy signal output from a microcontroller;
   if, as a result of the determination, the microcontroller is determined not to perform the internal operation, storing a received parameter in a first register;
   if, as a result of the determination, the microcontroller is determined to perform the internal operation, storing the received parameter in a second register;
   when a cache read command is received, storing in the first register a value stored in the second register, wherein the storage in the first register occurs in response to information stored as a flag of the second register; and
   performing a cache read operation according to the parameter stored in the first register.

2. The method of claim 1, wherein if, as a result of the determination, the microcontroller is determined to perform the internal operation, high-level data is stored as the flag of the second register.

3. The method of claim 2, wherein the storing in the first register of the value stored in the second register comprises storing in the first register a value stored in the second register if a logic high-level signal is stored as the flag of the second register.

4. The method of claim 1, wherein when the parameter setting command is received, read voltage information for the cache read operation is set.

5. A nonvolatile memory device, comprising:
   first and second registers;
   a microcontroller configured to control an operation of the nonvolatile memory device according to a parameter stored in the first register; and
   a control logic unit configured to store a parameter received through an input/output (IO) unit in the second register when a determination is made that the microcontroller performs an internal operation and store the received parameter in the first register when a determination is made that the microcontroller does not perform the internal operation.

6. The nonvolatile memory device of claim 5, wherein the control logic unit is configured to set a flag state of the second register to a logic high level when the received parameter is received via the IO unit while the microcontroller performs the internal operation.

7. The nonvolatile memory device of claim 5, wherein the microcontroller is configured to store data of the second register in the first register according to a flag state of the second register before performing an operation corresponding to the parameter stored in the first register.

* * * * *